(12) United States Patent
Pickering

(10) Patent No.: US 7,646,323 B2
(45) Date of Patent: Jan. 12, 2010

(54) CLOCK GENERATOR

(75) Inventor: Andrew J. Pickering, Rugby (GB)

(73) Assignee: Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 12/028,425

(22) Filed: Feb. 8, 2008

(65) Prior Publication Data

US 2009/0102692 A1 Apr. 23, 2009

Related U.S. Application Data

(60) Provisional application No. 61/016,953, filed on Dec. 27, 2007.

(30) Foreign Application Priority Data

Feb. 9, 2007 (GB) .................................. 0702629.7

(51) Int. Cl.
*H03M 1/10* (2006.01)

(52) U.S. Cl. ...................................... 341/158; 341/155
(58) Field of Classification Search .................. 341/100, 341/101; 375/340
See application file for complete search history.

(56) References Cited

U.S. PATENT DOCUMENTS 5,182,560 A * 1/1993 Shiwaku ...................... 341/158

(Continued)

FOREIGN PATENT DOCUMENTS

EP 1 207 624 A2 5/2002

(Continued)

OTHER PUBLICATIONS

Kobayashi et al.. A current-controlled latch sense amplifier and a static power-saving input buffer for low-power architecture, IEEE Journal of Solid State Circuits, Apr. 1993, vol. 28, Issue 4, pp. 523-527.*

*Primary Examiner*—Howard Williams
(74) *Attorney, Agent, or Firm*—Dawn V. Stephens; Wade James Brady, III; Frederick J. Telecky, Jr.

(57) ABSTRACT

The present invention relates to controlling the timing of a clock signal in high speed circuits, such as an analogue-digital converter (ADC). In some high speed data transfer techniques, the incoming data is latched using a clock signal. Often, the delay between the incoming data being clocked into the circuit and being ready to use (referred to as the "clock-to-Q period") is large enough to cause problems. In particular, the clock-to-Q period may be sufficient to result in the original clock signal being inappropriate to clock the latched signal. The present invention provides a data capture circuit with matched latch to address this issue, particularly a first latch having an input for receiving a data input signal; a first sense amplifier having an input coupled to an output of the first latch; a second latch having an input coupled to the output of the first sense amplifier and an output providing a first data output; and a clock generator, the clock generator comprising: a third latch having an input for receiving a first clock signal; a second sense amplifier having an input coupled to an output of said third latch; and a fourth latch having an input coupled to an output of said second sense amplifier and an output providing a first adjusted clock signal, wherein said first and third latches are substantially the same, the first and second sense amplifier are substantially the same and the second and fourth latches are substantially the same.

22 Claims, 9 Drawing Sheets

U.S. PATENT DOCUMENTS 5,721,503 A    2/1998  Burns et al.
7,187,222 B2 * 3/2007  Meltzer et al. .............. 327/202

FOREIGN PATENT DOCUMENTS

| | | | |
|---|---|---|---|
| EP | 1 207 624 A3 | 5/2002 | |
| GB | 2004150 A | 3/1979 | |
| JP | 59-226516 A | 6/1983 | |
| WO | WO 99/13584 | 8/1998 | |

* cited by examiner

CLOCK GENERATOR

This application claims priority under 35 U.S.C. 119(a) to GB Provisional Application No. 0702629.7 filed Feb. 9, 2007.

This application claims priority under 35 U.S.C. 119(e)(1) to U.S. Provisional Application No. 61/016,953 (TI-63538P) filed Dec. 27, 2007.

BACKGROUND OF THE INVENTION

The present invention relates to controlling the timing of a clock signal in high speed circuits, such as an analogue-digital converter (ADC).

High speed data transfer between semiconductor devices in an electronic system may be achieved by the use of a serialiser/deserialiser (SerDes). In order to avoid the use of a plurality of parallel connections between devices, a single differential analogue path is used running at a high data rate. One exemplary arrangement is specified by IEEE 802.3/AE/P.

In some high speed data transfer techniques, the incoming data is latched using a clock signal. Often, the delay between the incoming data being clocked into the circuit and being ready to use (referred to as the "clock-to-Q period") is large enough to cause problems. In particular, the clock-to-Q period may be sufficient to result in the original clock signal being inappropriate to clock the latched signal. Furthermore, the clock-to-Q period is typically process dependent and is often difficult to predict. It has proved to be difficult to provide clock signal timing in such circuits.

SUMMARY OF THE INVENTION

The present invention provides a data capture circuit comprising: a first latch having an input for receiving a data input signal; a first sense amplifier having an input coupled to an output of the first latch; a second latch having an input coupled to the output of the first sense amplifier and an output providing a first data output; and a clock generator, the clock generator comprising: a third latch having an input for receiving a first clock signal; a second sense amplifier having an input coupled to an output of said third latch; and a fourth latch having an input coupled to an output of said second sense amplifier and an output providing a first adjusted clock signal, wherein said first and third latches are substantially the same, the first and second sense amplifier are substantially the same and the second and fourth latches are substantially the same.

In a preferred form of the invention, said first and third latches are manufactured on the same substrate at the same time using the same process such that they are the same. In a similar manner, said first and second sense amplifiers may be manufactured on the same substrate at the same time using the same process such that they are the same and said second and fourth latches may be manufactured on the same substrate at the same time using the same process such that they are the same.

By providing circuit elements that same or substantially the same, the delays through the circuit elements should be the same. In this way, the data signal that passes through the first latch, the first sense amplifier and the second latch should be subject to the same, or substantially the same, delays as the clock signal that passes through the third latch, the second sense amplifier and the fourth latch.

In one form of the invention, the first and third latches are CML latches. CML latches are an example of latches that have small signal inputs. Of course, of suitable latches could be used.

In one form of the invention, the inputs to said sense amplifiers are differential inputs and the outputs of said sense amplifiers are complementary outputs. In one form of the invention, the sense amplifiers output a logic '1' or a logic '0' in dependence on whether the analogue data input is above or below a pre-set threshold.

The said second and fourth latches may be R-S latches, although this is not essential. The skilled person would be aware of many alternative latch configuration that could be used.

In one form of the invention, the first latch uses said first clock signal as a clock input such that data latched by said first latched is latched by the same clock signal that provides the input to said clock generator.

The data capture circuit of the present invention may further comprise a plurality of said first latches arranged in parallel, a plurality of said first sense amplifiers arranged in parallel and a plurality of said second latches arranged in parallel, wherein said plurality of first latches receive a plurality of data inputs and said plurality of third latches provide a first plurality of data outputs. The inputs of each of said plurality of first latches may be connected to the same data input.

As mentioned above, the plurality of first latches may be CML latches and the plurality of second latches may be R-S latches, but other suitable latches could be used instead.

The plurality of first latches may use said first clock signal as a clock input, for the reasons outlined above.

In one embodiment of the invention, the plurality of first latches, the plurality of first sense amplifiers and the plurality of said second latches form a first analogue-to-digital converter.

Each sense amplifier of said plurality of said first sense amplifier may compare data received at its input with a preset level. The preset level may be different for each sense amplifier. In this way, the plurality of first sense amplifier may provide a thermometer code output. Such codes and their uses are well known in the art.

The data capture circuit of the present invention may further comprise: a fifth latch having an input for receiving said data input signal; a third sense amplifier having an input coupled to an output of the fifth latch; a sixth latch having an input coupled to an output of the third sense amplifier and an output providing a second data output; and a second clock generator, the second clock generator comprising: a seventh latch having an input for receiving a second clock signal; a fourth sense amplifier having an input coupled to an output of said seventh latch; and an eighth latch having an input coupled to the output of said fourth sense amplifier and an output providing a second adjusted clock signal, wherein said fifth and seventh latches are substantially the same, the third and fourth sense amplifiers are substantially the same and the sixth and eighth latches are substantially the same.

In a preferred form of the invention, said fifth and seventh latches are manufactured on the same substrate at the same time using the same process such that they are the same. In a similar manner, said third and fourth sense amplifiers may be manufactured on the same substrate at the same time using the same process such that they are the same and said sixth and eighth latches may be manufactured on the same substrate at the same time using the same process such that they are the same.

Moreover, in one embodiment of the invention, the first, third, fifth and seventh latches are the same (or substantially the same), the first, second, third and fourth sense amplifiers are the same (or substantially the same) and the second, fourth, sixth and eighth latches are the same (or substantially the same)

The said fifth latch may use said second clock signal as a clock input.

The first and second clock signals may be complementary clock signals.

The data capture circuit of the present invention may further comprise a plurality of said fifth latches arranged in parallel, a plurality of said third sense amplifiers arranged in parallel and a plurality of said sixth latches arranged in parallel, wherein said plurality of fifth latches receive a or the plurality of data inputs and said plurality of eighth latches provide a second plurality of data outputs.

In one form of the invention, the plurality of fifth latches, the plurality of third sense amplifiers and the plurality of sixth latches form a second analogue-to-digital converter.

The present invention also provides an analogue-to-digital converter comprising: a plurality of first latches, each having an input for receiving a data input signal; a plurality of first sense amplifiers, each having an input coupled to an output of a respective one of the first latches; a plurality of second latches, each having an input coupled to the output of a respective one of the first sense amplifiers and an output, the outputs of said plurality of first latches providing a first plurality of data outputs; and a clock generator, the clock generator comprising: a third latch having an input for receiving a first clock signal; a second sense amplifier having an input coupled to the an output of said third latch; and a fourth latch having an input coupled to the output of said second sense amplifier and an output providing a first adjusted clock signal, wherein said third latch and each of said plurality of first latches are substantially the same, said second sense amplifier and each of said first plurality of sense amplifiers are substantially the same and said fourth latch and each of said plurality of second latches are. Each of said plurality of first latches may use said first clock signal as a clock input.

The analogue-to-digital converter may further comprise: a plurality of fifth latches, each having an input for receiving a or the data input signal; a plurality of third sense amplifiers, each having an input coupled to an output of a respective one of said fifth latches; a plurality of sixth latches, each having an input coupled to an output of a respective one of the third sense amplifiers and an output providing a second data output; and a second clock generator, the second clock generator comprising: a seventh latch having an input for receiving a second clock signal; a fourth sense amplifier having an input coupled to the an output of said seventh latch; and an eighth latch having an input coupled to the output of said fourth sense amplifier and an output providing a second adjusted clock signal, wherein said seventh latch and each of said plurality of fifth latches are substantially the same, the fourth sense amplifier and each of said plurality of third sense amplifiers are substantially the same and the eighth latch and each of said plurality of seventh latches are substantially the same. The said plurality of fifth latches may use said second clock signal as a clock input.

In one form of the invention, the first and second clock signals are complementary clock signals.

The present invention further provides a method of capturing data, the method comprising the steps of: latching an analogue data signal to generate a first latched data signal in response to a first input clock signal; passing said first latched data signal through a first sense amplifier; and latching the output of said first sense amplifier to generate said first digital data signal, the method further comprising the steps of generating a first output clock signal by: latching said first input clock signal to generate a first latched clock signal; passing said first latched clock signal through a second sense amplifier; and latching the output of said sense amplifier to generate said first output clock signal.

The method of the present invention may further comprise the steps of: latching said analogue data signal to generate a second latched data signal in response to a second input clock signal; passing said second latched data signal through a third sense amplifier; and latching the output of said third sense amplifier to generate a second digital data signal, the method may further comprise the steps of generating a second output clock signal by: latching said second clock input signal to generate a second latched clock signal; passing said second latched clock signal through a fourth sense amplifier; latching the output of said fourth sense amplifier to generate said second output clock signal.

Further, the said first and second input clock signals may be complementary clock signals.

BRIEF DESCRIPTION OF THE DRAWINGS

Examples of the invention will now be described with reference to the accompanying drawings, of which.

DETAILED DESCRIPTION OF THE PREFERRED EMBODIMENTS

A key challenge facing designers of high-bandwidth systems such as data-routers and super-computers is the requirement to transfer large amounts of data between ICs—either on the same circuit board or between boards. This data transmission application is called Serialisation-Deserialisation or "SerDes" for short. The present invention is useful in SerDes circuit and indeed was developed for that application. Nonetheless the invention may be used in other applications.

Analysis of typical backplane channel attenuation (which is around −24 dB) and package losses (−1 to −2 dB) in the presence of crosstalk predict that an un-equalized transceiver provides inadequate performance and that decision feedback equalization (DFE) is needed to achieve error rates of less than $10^{-17}$.

Traditional decision-feedback equalization (DFE) methods for SerDes receivers rely on either modifying, in analogue, the input signal based on the data history ["A 6.25 Gb/s Binary Adaptive DFE with First Post-Cursor tap Cancellation for Serial backplane Communications" R Payne et al *ISSCC* 2005; "A 6.4 Gb/s CMOS SerDes Core with feed-forward and Decision Feedback Equalization" M. Sorna et al *ISSCC* 2005; "A 4.8-6.4 Gb/s serial Link for Backplane Applications Using Decision Feedback Equalization" Balan et al *IEEE JSSC November* 2005.] or on having an adaptive analogue slicing level ["Techniques for High-Speed implementation of Non-linear cancellation" S. Kasturia *IEEE Journal on selected areas in Communications. June* 1991.] (i.e. the signal level at which the circuit decides whether the signal represents a 1 or a 0).

Figure 1:
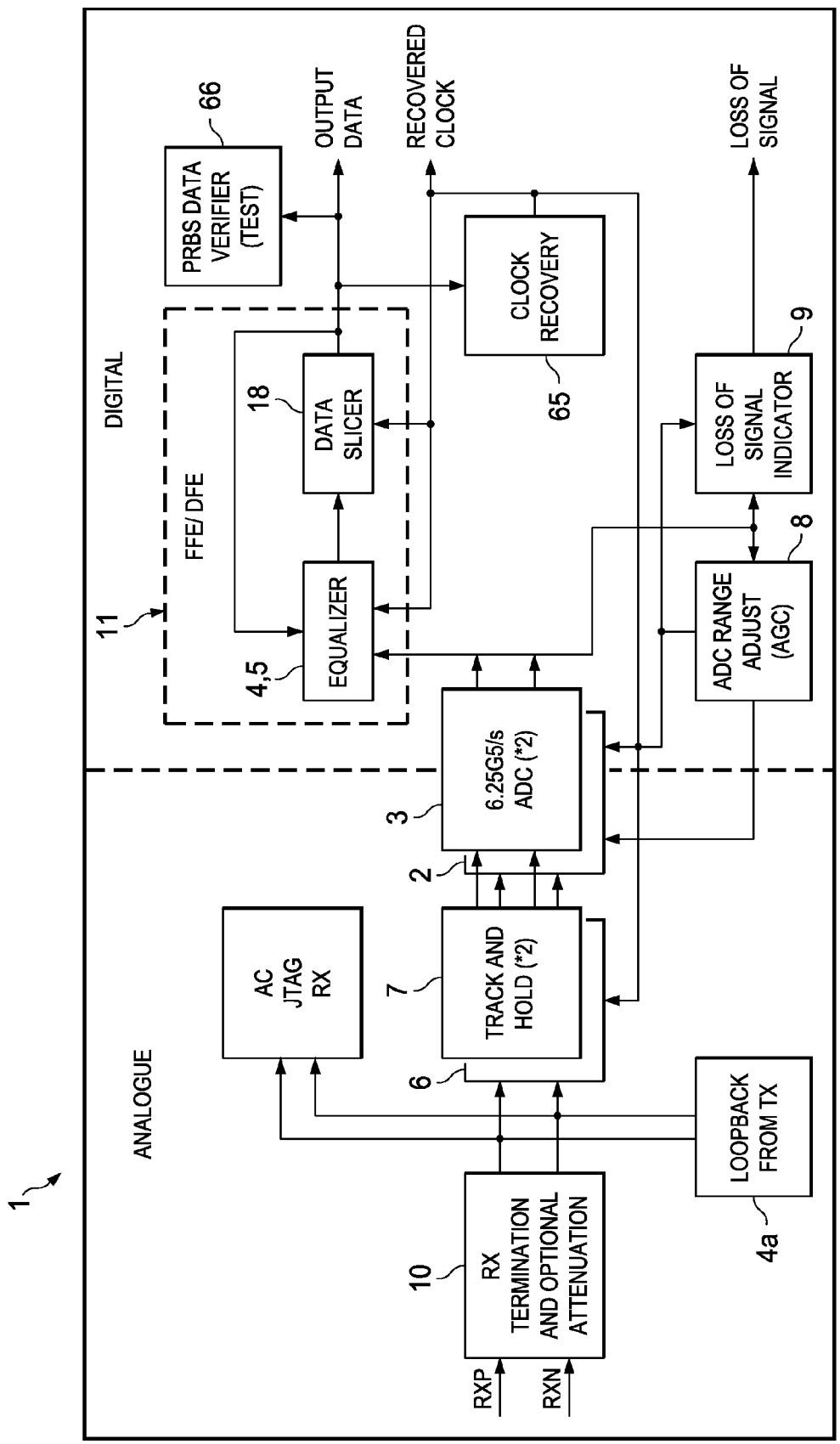
FIG. 1 is a block diagram of a receiver circuit, in which the invention may be used.

A block diagram of a SerDes receiver circuit 1, which forms part of an integrated circuit, in which the present invention may be used is shown in FIG. 1. The invention may nonetheless be used in other applications.

In the receiver circuit 1 of FIG. 1 the input data is sampled at the baud-rate, digitized and the equalization and clock & data recovery (CDR) performed using numerical digital processing techniques. This approach results in the superior power/area scaling with process of digital circuitry compared to that of analogue, simplifies production testing, allows straightforward integration of a feed-forward equalizer and provides a flexible design with a configurable number of filter taps in the decision feedback equaliser. The circuit has been implemented in 65 nm CMOS, operating at a rate of 12.5 Gb/s.

The receiver circuit 1 comprises two baud-rate sampling ADCs (analogue to digital converters) 2 and 3, a digital 2-tap FFE (feed forward equaliser) 4 and digital 5-tap DFE (decision feedback equaliser) 5 to correct channel impairments.

The SerDes section of the integrated circuit, which includes the receiver circuit 1 is also provided with a transmitter 40 (FIG. 4), connected to transmit data over a parallel channel to that which the receiver circuit 1 is connected to receive data. The transmitter 40 comprises a 4-tap FIR filter to pre-compensate for channel impairments. In many applications the integrated circuit transmitting data to the receiver circuit 1 uses pre-compensation and in particular a similar transmitter circuit 40, but in other applications the receiver circuit 1 works without pre-compensation being used at the other end The receiver 1 of FIG. 1 is now described in more detail. The received data is digitized at the baud-rate, typically 1.0 to 12.5 Gb/s, using a pair of interleaved track and hold stages (T/H) 6 and 7 and a respective pair of 23 level (4.5 bit) full-flash ADCs 2 and 3 (i.e. they sample and convert alternate bits of the received analogue data waveform). The two track & hold circuits enable interleaving of the half-rate ADCs and reduce signal related aperture timing errors. The two ADCs, each running at 6.25 Gb/s for 12.5 Gb/s incoming data rate provide baud-rate quantization of the received data. The ADC's dynamic range is normalized to the full input amplitude using a 7-bit automatic gain control (AGC) circuit 8. A loss of signal indication is provided by loss of signal unit 9 that detects when the gain control signal provided by the AGC is out-of-range. An optional attenuator is included in the termination block 10, which receives the signals from the transmission channel, to enable reception of large signals whilst minimizing signal overload.

Figure 2:
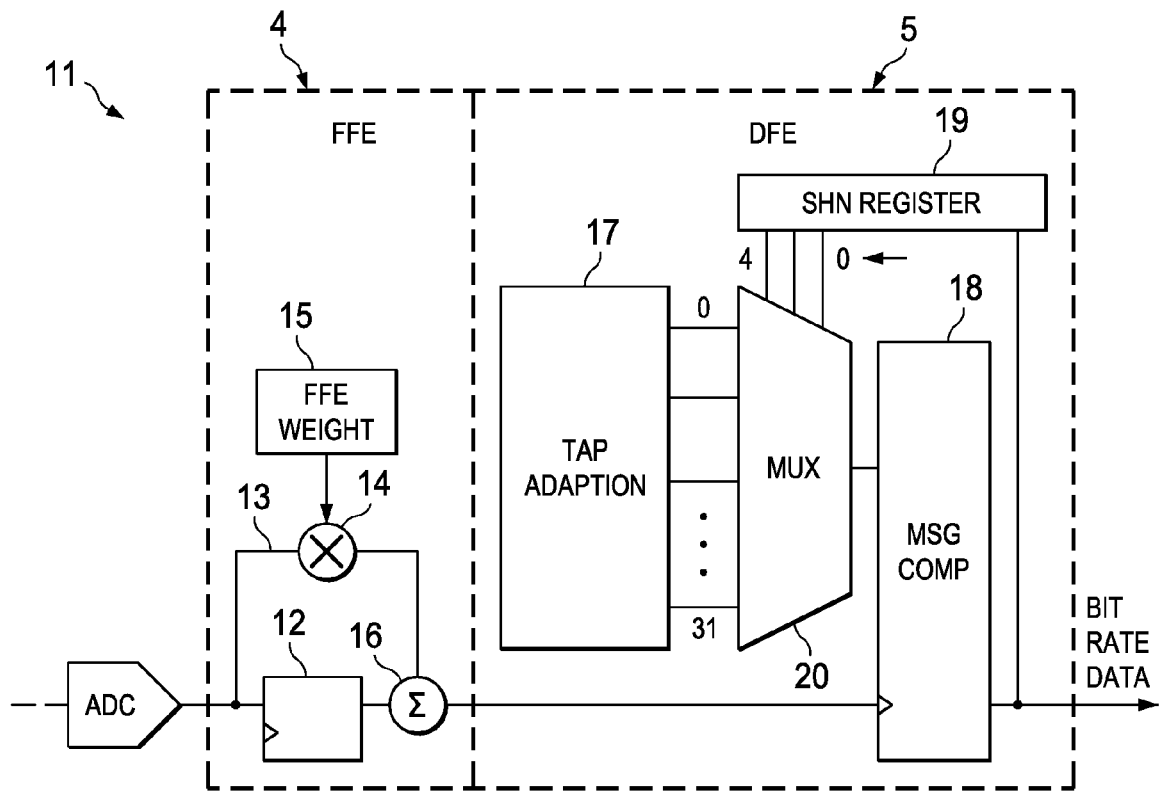
FIG. 2 shows the feed forward equaliser and the decision feedback equaliser of the receiver circuit of FIG. 1.

The digital samples output from the ADCs 2 and 3 are interleaved and the resulting stream of samples is fed into a custom digital signal processing (DSP) data-path that performs the numerical feed-forward equalization and decision-feedback equalization. This is shown in FIG. 2. This comprises a 1 UI delay register 12 connected to receive the stream of samples from the ADCs 2 and 3. (1 UI is a period of the clock, i.e. the delay between bits.) A tap 13 also feeds the samples from the ADCs to a multiplier 14, each sample being received by the delay latch 12 and the multiplier 14 at the same time. The multiplier 14 multiplies each sample by a constant weight value (held in a programmable register 15), which value is typically 10%. The outputs of the multiplier 14 and the delay register 12 are added together by an adder 16 to provide the output of the FFE 4.

The digital FFE/DFE is implemented using standard 65 nm library gates.

An advantage of applying the equalization digitally is that it is straightforward to include feed-forward equalization as a delay-and-add function without any noise-sensitive analogue delay elements. The FFE tap weight is selected before use to compensate for pre-cursor ISI and can be bypassed to reduce latency. Whilst many standards require pre-cursor de-emphasis at the transmitter, inclusion at the receiver allows improved bit error rate (BER) performance with existing legacy transmitters.

The DFE 5 uses an unrolled non-linear cancellation method ["Techniques for High-Speed implementation of Non-linear cancellation" S. Kasturia *IEEE Journal on selected areas in Communications*. June 1991]. The data output (i.e. the 1s and 0s originally transmitted) is the result of a magnitude comparison between the output of the FFE 4 and a slicer-level dynamically selected from a set stored in a set 17 of pre-programmed registers. The values are determined by a control circuit (not shown in FIG. 1) from the waveforms of test patterns sent during a setup phase of operation. The magnitude comparison is performed by a magnitude comparator 18 connected to receive the output of the FFE 4 and the selected slicer-level; it outputs a 1 if the former is higher than the latter and a 0 if it is lower or equal, thereby forming the output of the DFE 5.

The slicer-level is selected from one of 2n possible options depending on the previous n bits of data history. The history of the bits produced by the magnitude comparator 18 is recorded by a shift register 19 which is connected to shift them in. The parallel output of the shift register is connected to the select input of a multiplexer 20 whose data inputs are connected to the outputs of respective ones of the set 17 of registers holding the possible slicer-levels.

Unrolled tap adaption is performed using a least mean square (LMS) method where the optimum slicing level is defined to be the average of the two possible symbol amplitudes ($+/-1$) when proceeded by identical history bits. (For symmetry the symbols on the channel for the bit values 1 and 0 are given the values $+1$ and $-1$).

Although 5-taps of DFE were chosen for this implementation, this parameter is easily scaleable and performance can be traded-off against power consumption and die area. In addition, the digital equalizer is testable using standard ATPG (automatic test pattern generation) and circular built-in-self-test approaches.

Figure 3:
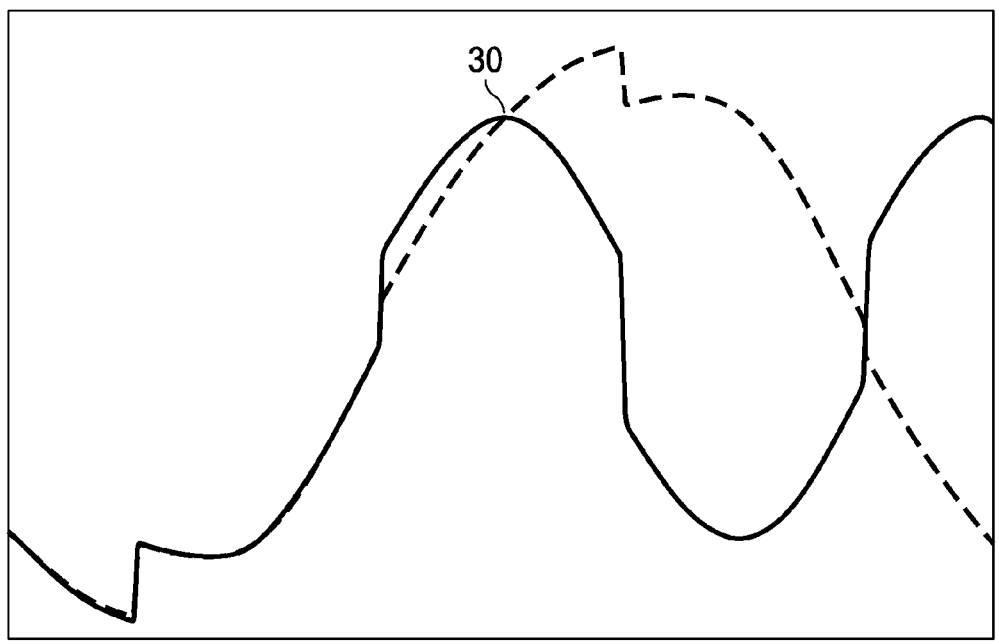
FIG. 3 is a graph showing the post equalised signal amplitude for exemplary bit patterns.

The chosen clock recovery approach uses a Muller-Mueller approach ["Timing recovery in Digital Synchronous Data Receivers" Mueller and Muller *IEEE Transactions on Communications* May 1976.] where the timing function adapts the T/H sample position to the point where the calculated pre-cursor inter-symbol interference (ISI) or $h(-1)$ is zero, an example being given in FIG. 3. The two curves show the post-equalized response for 010 and 011 data sequences respectively. The intersection 30 at 3440 ps occurs when the sample of the second bit is independent of the third bit—that is, h(−1)=0. This position can be detected by comparing the post-equalized symbol amplitude with the theoretical amplitude h(0) and using the difference to update the CDR's phase-interpolator.

Figure 4:
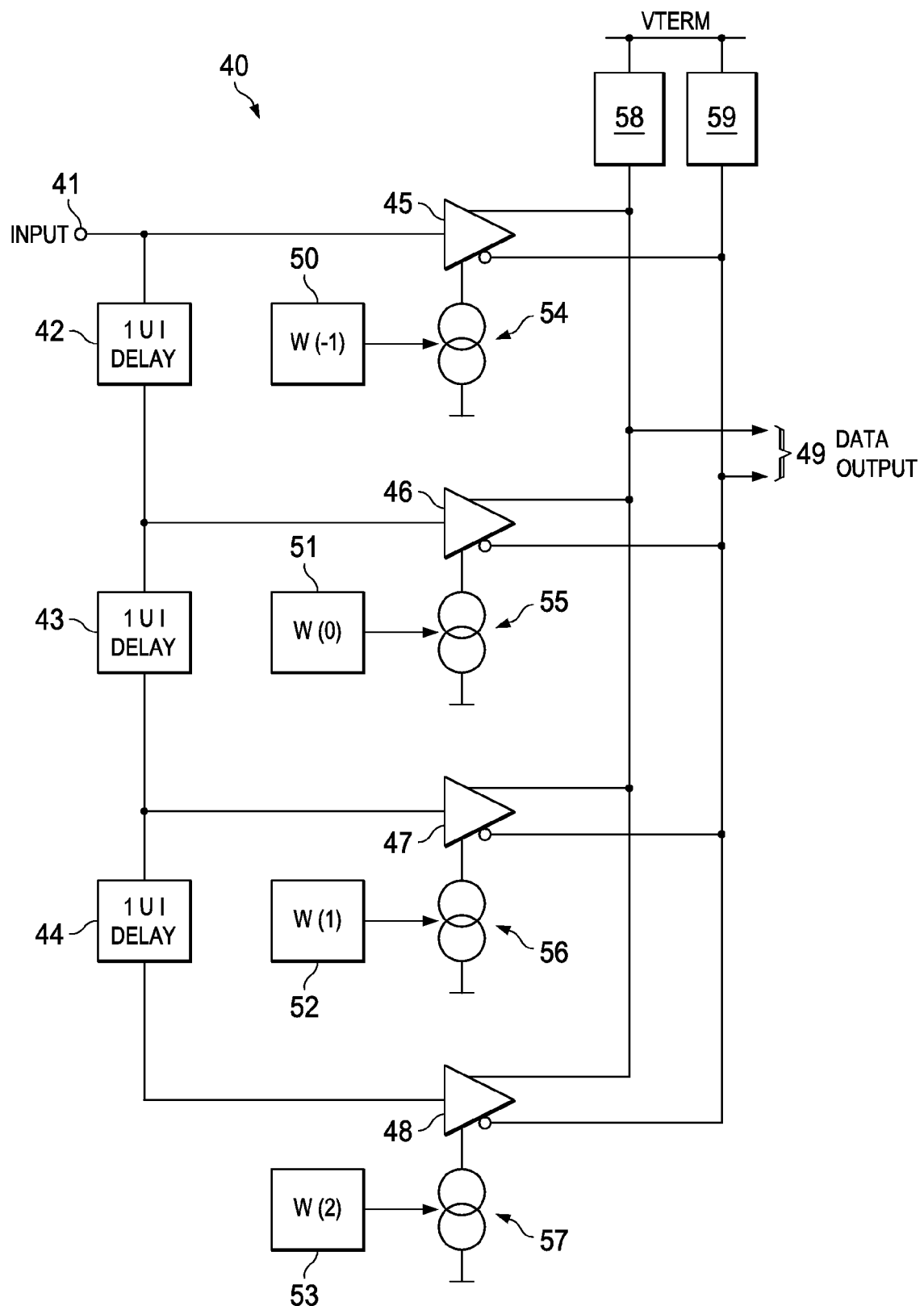
FIG. 4 is a diagram of a transmitter, with which the invention may be used.

A block diagram of the transmitter is shown in FIG. 4, which is implemented using CML techniques. The data to be transmitted (received at terminal 41) is sequentially delayed by three 1 UI delay registers 42, 43 and 44 connected in series. They produce, via the four taps before and after each delay, a nibble-wide word containing the pre-cursor, cursor and two post-cursor components. In fact to ease timing closure the data is sent to the transmitter from the digital part of the circuit that supplies the data in blocks of 4 nibbles (16 bits in parallel), the blocks being sent at a rate of 3.125/s. Each nibble is a frame of four bits of the bitstream offset by one bit from the next so the nibbles overlap and represent the data redundantly. A multiplexer then selects one of the nibbles, switching between them at a rate of $12.5 \times 10^9$/s, and presents that in parallel to the four taps, thereby making the bitstream appear to advance along the taps.

A 4-tap FIR output waveform is obtained from simple current summing of the time-delayed contributions. This is done with differential amplifiers 45 to 48, each having its inputs connected to a respective one of the taps and having its differential output connected to a common differential output 49. Although shown as four differential amplifiers the circuit is implemented as one differential amplifier with four inputs, which minimizes return-loss. The relative amplitude of each contribution is weighted to allow the FIR coefficients to be optimized for a given circuit (e.g. a backplane) and minimize the overall residual ISI. The weights are determined empirically either for a typical example of a particular backplane or once a backplane is populated and are stored in registers 50 to 53. The weights respectively control the controllable driving current sources 54 to 57 of the differential amplifiers 45 to 48 to scale their output current accordingly. Respective pull-up resistors 58 and 59 are connected to the two terminals of the differential output 49.

A PLL is used to generate low-jitter reference clocks for the transmitter and receiver to meet standards["OIF-CEI-02.0—Common Electrical I/O (CEI)—Electrical and Jitter Interoperability agreements for 6G+ bps and 11G+ bps I/O". *Optical Internetworking Forum, February* 2005; "IEEE Draft 802.3 ap/Draft 3.0—Amendment: Electrical Ethernet Operation over Electrical Backplanes" IEEE July 2006.]. Most integrated circuits will have more than one receiver 1 and the PLL is shared between them with each receiver having a phase interpolator to set the phase to that of incoming data.

The PLL uses a ring oscillator to produce four clock-phases at a quarter of the line data-rate. The lower speed clocks allow power efficient clock distribution using CMOS logic levels, but need duty-cycle and quadrature correction at the point of use. The 3.125 GHz clocks are frequency doubled (XOR function) to provide the 6.25 GHz clock for the T/H & ADC. The transmitter uses the four separate 3.125 GHz phases, but they require accurate alignment to meet jitter specifications of 0.15UI p-p R.J. and 0.15UI p-p D.J.

The system described has been fabricated using a 65 nm CMOS process and has been shown to provide error-free operation at 12.5 Gb/s over short channels (two 11 mm package traces, 30 cm low-loss PCB and two connectors). A legacy channel with −24 dB of attenuation at 3.75 GHz supports error free operation at 7.5 Gb/s.

Figure 5A:
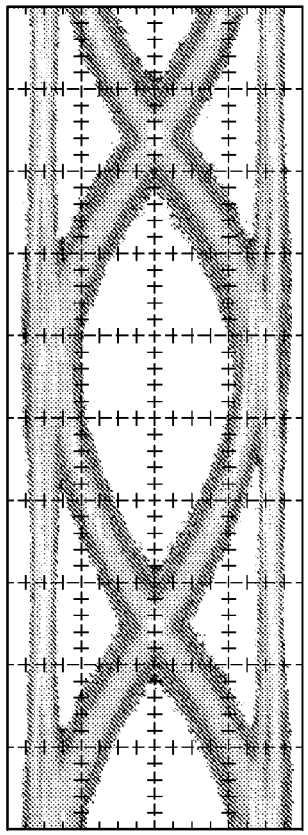
FIG. 5a shows the response of the receiver to a PRBS transmitted eye-pattern.
Figure 5B:
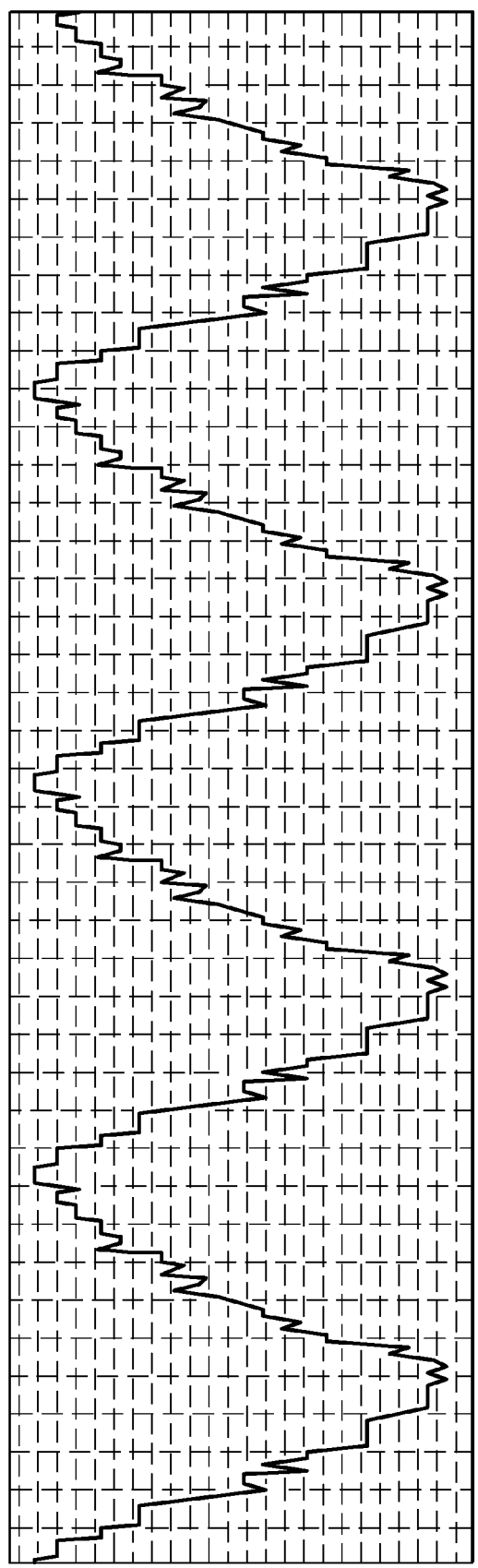
FIG. 5b shows the interleaved output of the ADCs of the receiver.

FIG. 5a shows a 12.5 Gb/s 27-1 pseudo random bit stream (PRBS) transmitted eye-pattern with 20% de-emphasis on the first post-cursor. The receiver includes, for test purposes, a PRBS data verifier 66, which confirms that the test pattern has been received. The differential peak-to-peak (pp) amplitude is 700 mV (200 mV/div). FIG. 5b shows the ADC output when a 6.25 GHz sine-wave is sampled and the phase between the sine-wave and receiver is incremented using a programmable delay-line. The measured codes are within +/−1 lsb (least significant bit) of the expected values. This level of performance ensures robust operation over a wide range of cables, green-field and legacy channels. The worst-case power of a single TX/RX pair, or "lane" is 330 mW and the total exemplary macro area is 0.45 mm$^2$ per lane (allowing for the PLL being shared by four TX/RX lanes.

Figure 6:
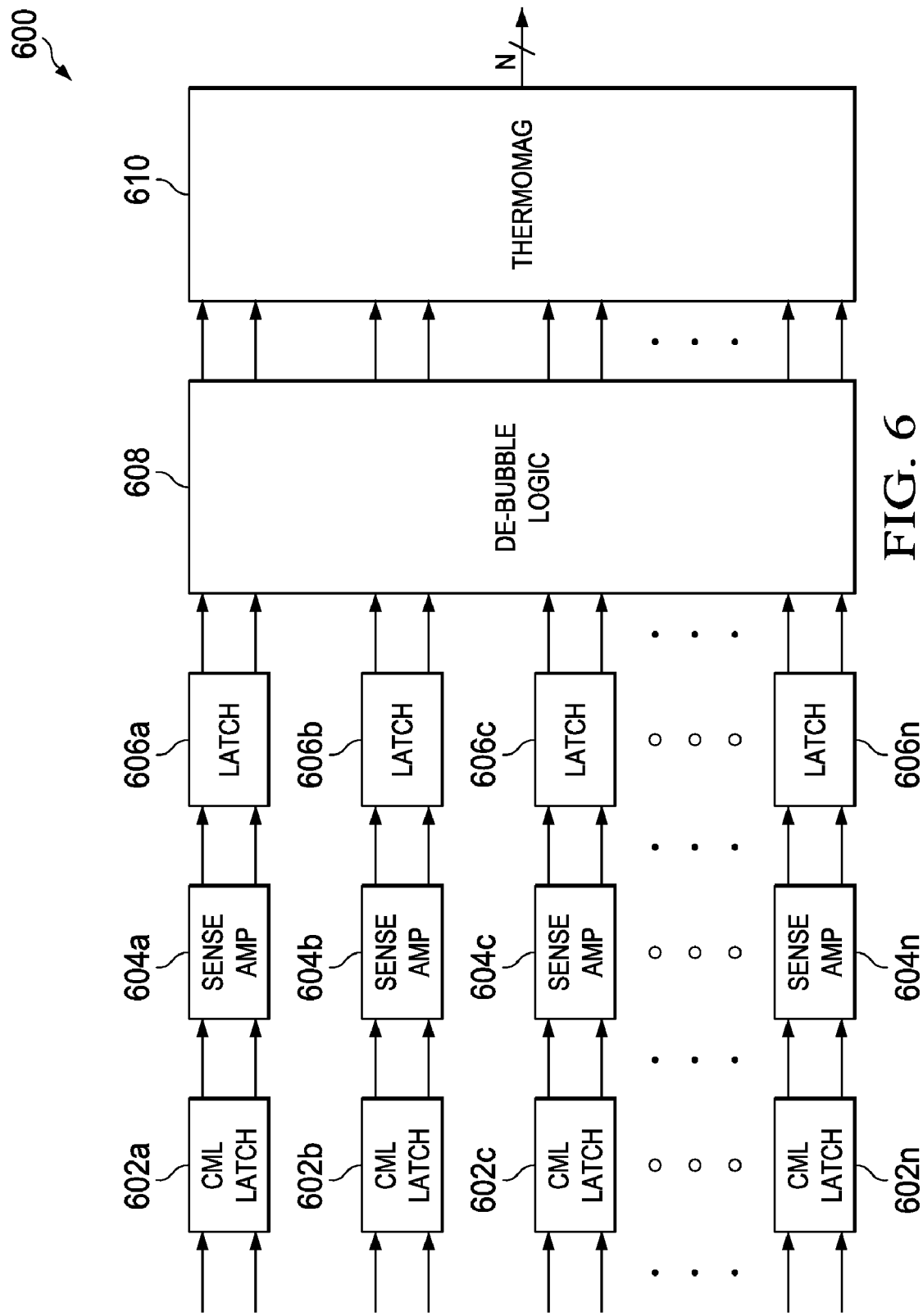
FIG. 6 is a block diagram of an input stage of an ADC used in an application of the present invention.

FIG. 6 is a block diagram showing an input stage of an ADC used in an embodiment of the present invention. The ADC input stage, indicated generally by the reference numeral 600, comprises a plurality of CML latches 602a, 602b, 602c . . . 602n, each having a differential input and a differential output, a plurality of sense amplifiers 604a, 604b, 604c . . . 604n, each having a differential input and providing a complementary output, a plurality of R-S latches 606a, 606b, 606c . . . 606n, each having a complementary input and providing a complementary output, a de-bubble logic circuit 608 having a plurality of complementary inputs and a plurality of complementary outputs, and a thermometer-to-magnitude converter, having a plurality of complementary inputs and providing a multi-bit logic output.

Together, the CML latches 602a . . . 602n, the sense amplifiers 604a . . . 604n and the R-S latches 606a . . . 606n form a data capture portion of the ADC 600 and the de-bubble logic 608 and thermometer-to-magnitude converter 610 form a data processing portion of the ADC 600.

The ADC circuit 600 receives a differential input and provides a multi-bit digital output. The differential input is coupled to the input of each of said CML latches 602a . . . 602n. The outputs of the CML latches 602a . . . 602n are coupled to the inputs of sense amplifiers 604a . . . 604n respectively. The outputs of the sense amplifiers 604a, . . . 604n are coupled to the inputs of latches 606a . . . 606n respectively. The outputs of latches 606a . . . 606n are each coupled to inputs of said de-bubble logic circuit 608. The outputs of de-bubble-circuit 608 are coupled to the inputs of thermometer-magnitude converter 610.

The sense amplifiers 604a . . . 604n are arranged to determine whether the differential input is above or below a pre-set level. Each of the sensor amplifiers is set at a different level. Thus, some of the sense amplifiers will output a logic high, indicative of the incoming data signal being above the threshold of that amplifier, and the remainder of the amplifiers will output a logic low, indicative of the incoming data being below that threshold.

The resulting outputs from the sense amplifiers, once latched by the appropriate one of the latches 606a . . . 606n, and converted to a digital signal for use by the de-bubble logic 608 should, in one exemplary embodiment, be as set out in table 1 below:

TABLE 1

| Signal level* | Thermometer Code |
|---|---|
| 15 | 1111111111111111 |
| 14 | 0111111111111111 |
| 13 | 0011111111111111 |
| 12 | 0001111111111111 |

TABLE 1-continued

| Signal level* | Thermometer Code |
|---|---|
| 11 | 000011111111111 |
| 10 | 000001111111111 |
| 9 | 000000111111111 |
| 8 | 000000011111111 |
| 7 | 000000001111111 |
| 6 | 000000000111111 |
| 5 | 000000000011111 |
| 4 | 000000000001111 |
| 3 | 000000000000111 |
| 2 | 000000000000011 |
| 1 | 000000000000001 |
| 0 | 000000000000000 |

*taking a unit interval between thermometer codes and the zero level to be binary code 0000.

In any thermometer code, errors typically occur from time-to-time in the transition area, that is, the area where the data should change from a logic '0' to a logic 'A'. Thus, the thermometer output can take the form: 000001011111, which is clearly incorrect. The de-bubble logic 608 is provided to correct such errors.

The output of the de-bubble logic 608 is provided to a thermometer-to-magnitude converter 610, which simply converts the thermometer code into a format indicative of the magnitude. By way of example, a binary coded decimal format or a Gray code could be used. Table 2 below provides exemplary data conversions that could be implemented by the converter 610.

TABLE 2

| Thermometer Code | Gray Code | Binary Code |
|---|---|---|
| 111111111111111 | 1000 | 1111 |
| 011111111111111 | 1001 | 1110 |
| 001111111111111 | 1011 | 1101 |
| 000111111111111 | 1010 | 1100 |
| 000011111111111 | 1110 | 1011 |
| 000001111111111 | 1111 | 1010 |
| 000000111111111 | 1101 | 1001 |
| 000000011111111 | 1100 | 1000 |
| 000000001111111 | 0100 | 0111 |
| 000000000111111 | 0101 | 0110 |
| 000000000011111 | 0111 | 0101 |
| 000000000001111 | 0110 | 0100 |
| 000000000000111 | 0010 | 0011 |
| 000000000000011 | 0011 | 0010 |
| 000000000000001 | 0001 | 0001 |
| 000000000000000 | 0000 | 0000 |

Suitable circuits for implementing the de-bubble circuit 608 and the thermometer-magnitude converter 610 are well known to those skilled in the art. Furthermore, the implementation of those circuits is not critical to the present invention. Accordingly, no further description of those circuits will be provided herein.

Each of the CML latches 602a ... 602n and sense amplifiers 604a ... 604n receive the same clock signal. The data so received is then latched using latches 606a ... 606n before passing through logic stages 608 and 610.

Of course, the data output by logic stage 610 is delayed as a result of passing through the various stages of the circuit 600. In one embodiment of the invention, data is provided at the input at a rate of 6 Gbits/second. At this data rate, the delay introduced by the circuit 600 is significant. Furthermore, the delay is unpredictable and is dependent on process and operating conditions.

As a result of the uncertain delays introduced by the circuit 600, it is difficult to provide a clock signal at the output of the circuit that is related to the data output by the logic 610.

A further complication is caused in the SerDes structure by the use of two ADC circuits operating in parallel. A first ADC circuit 600, as shown in FIG. 6, receives data on a first transition of a clock signal (such as on low to high clock transitions). A second ADC circuit 600', identical to the ADC circuit 600, receives data on a second transition of the clock signal (such as high to low clock transitions). As discussed above, providing two ADC circuits operating in parallel allows the high data rates required by SerDes to be achieved. However, this structure further complicates the clock generation scheme required to synchronise the data output by the ADC circuits 600 and 600' with a clock signal.

Figure 7:
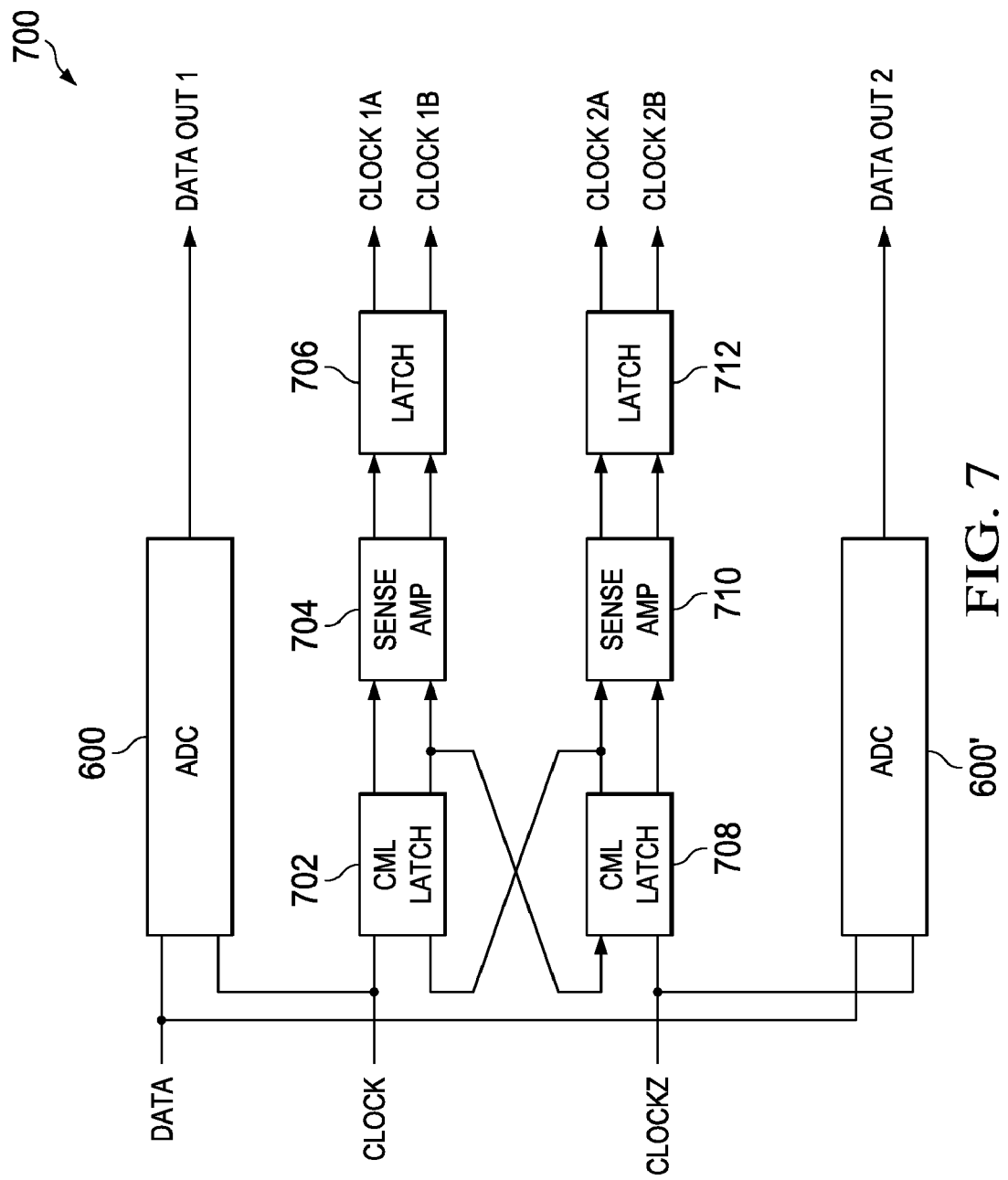
FIG. 7 is a block diagram of a clock adjust circuit in accordance with an embodiment of the present invention.

FIG. 7 is a block diagram of a circuit, indicated generally by the reference numeral 700, in accordance with an embodiment of the present invention. The circuit 700 comprises a first ADC circuit 600 and a second ADC circuit 600' as described above and also comprises first 702 and second 708 CML latches, first 704 and second 710 sense amplifiers and first 706 and second 712 R-S latches.

The CML latches 702 and 708 are identical to the CML latches 602a ... 602n described above with reference to FIG. 6. Similarly, the sense amplifiers 704 and 710 are identical to sense amplifiers 604a ... 604n and the latches 706 and 712 are identical to latches 606a ... 606n.

In FIG. 7, the data input DATA is clocked into the first ADC 600 under the control of the clock signal CLOCK. That clock signal also passes through CML latch 702, sense amplifier 704 and latch 706 before being output as complementary clock signals CLOCK 1A and CLOCK 1B. The ADC 600 provides a data signal DATA OUT 1 at its output.

In this way, the clock signals CLOCK 1A and CLOCK 1B are subjected to the same delays as the data signal DATA OUT 1. According, DATA OUT 1 should be aligned with the clock signals CLOCK 1A and CLOCK 1B.

Similarly, the data input DATA is clocked into the second ADC 600' under the control of the clock signal CLOCKZ (the inverse of CLOCK). CLOCKZ also passes through CML latch 708, sense amplifier 710 and latch 712 and is output as the complementary clock signals CLOCK 2A and CLOCK 2B, whilst the data input DATA passes through ADC 600', with that circuit providing a data signal DATA OUT 2 at its output. In this way, the clock signals CLOCK 2A and CLOCK 2B are subjected to the same delays as the data signal DATA OUT 2. According, DATA OUT 2 should be aligned with the clock signals CLOCK 2A and CLOCK 2B.

The functionality of the circuit 700 is described further below with reference to the timing diagram of FIG. 8.

Figure 8:
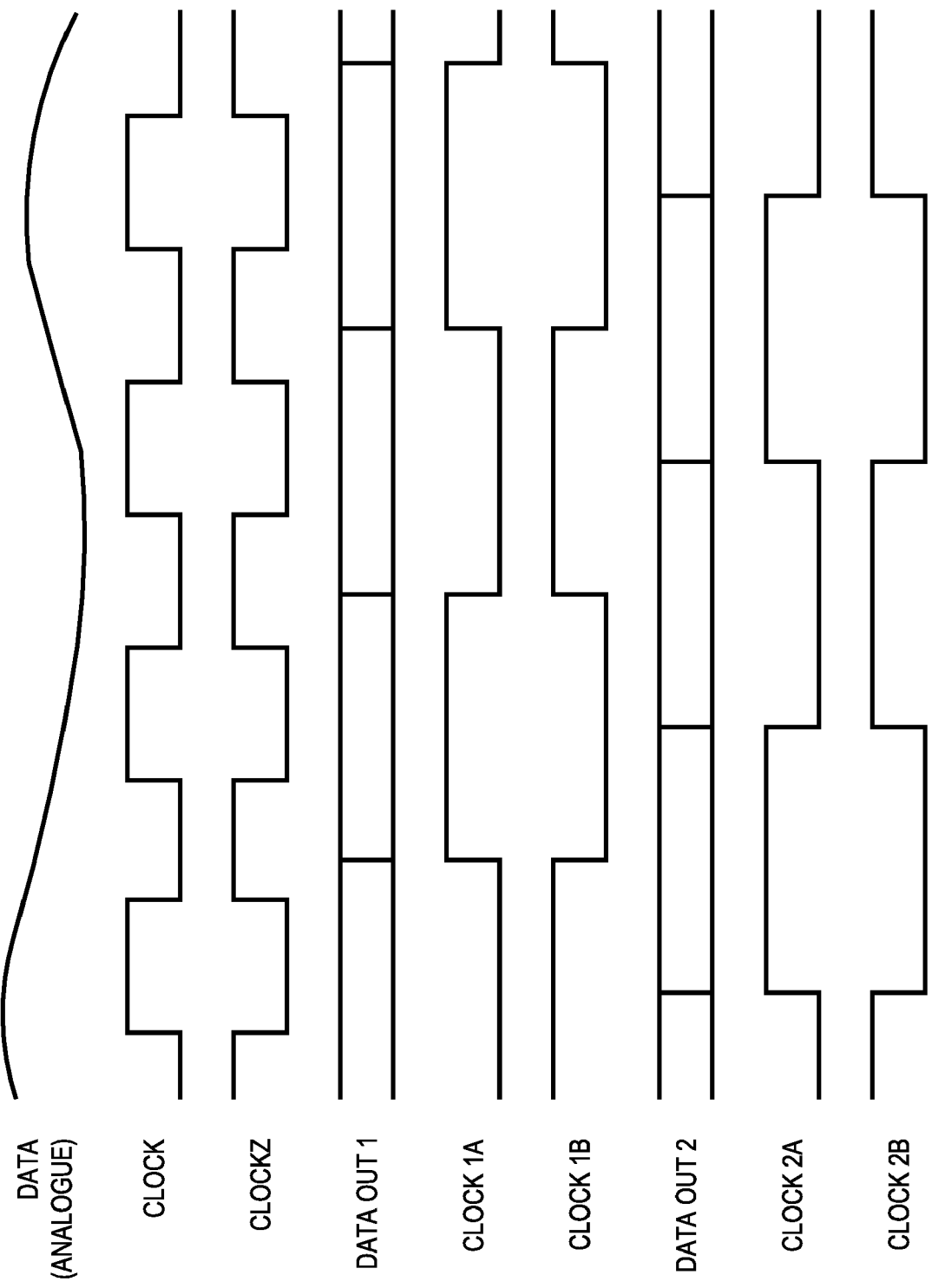
FIG. 8 is a timing diagram demonstrating the functionality of the circuit of FIG. 7.

FIG. 8 shows an analogue data input signal DATA and complementary clock signals CLOCK and CLOCKZ used to latch the data input signal. The data output DATA OUT 1 is shown aligned with the clock signals CLOCK 1A and CLOCK 1B. As shown in FIG. 8, the clock signals CLOCK 1A and CLOCK 1B are derived from the clock input CLOCK and are have half the frequency of the clock input.

The data output DATA OUT 2 is shown aligned with the clock signals CLOCK 2A and CLOCK 2B. As shown in FIG. 8, the clock signals CLOCK 2A and CLOCK 2B are derived from the clock input CLOCKZ are have half the frequency of the clock input.

Figure 9:
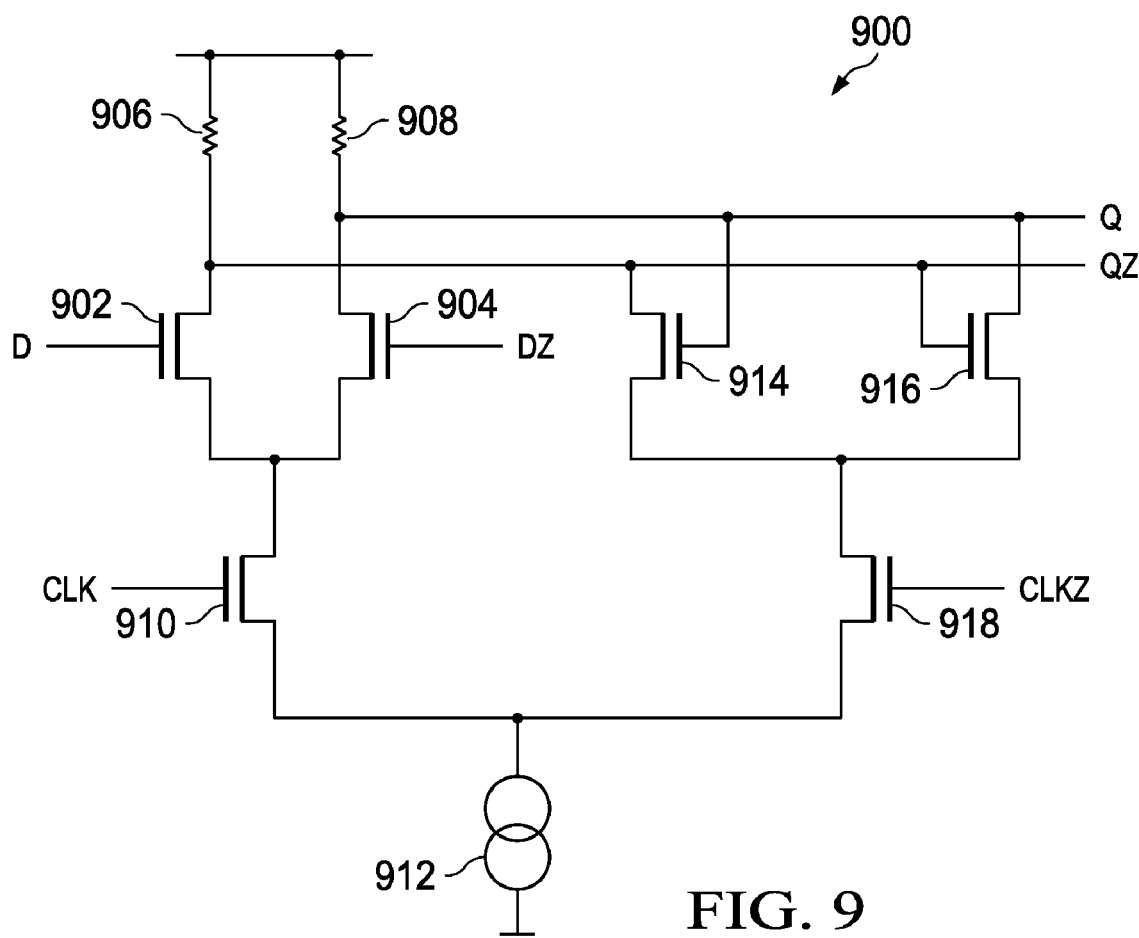
FIG. 9 shows an exemplary circuit diagram of a CML latch suitable for use in the circuit of FIG. 6 and FIG. 7.

FIG. 9 shows an exemplary form of the CML latch, indicated generally by the reference numeral 900, used in embodiments of the present invention. The latch 900 comprises first and second NMOS transistors 902 and 904 having gates coupled to data inputs D and DZ respectively. The transistor 902 has a drain coupled to an output QZ and a pull-up resistor 906: the transistor 904 has a drain coupled to an output Q and a pull-up resistor 908. A third NMOS transistor 910 has a gate coupled to a clock input CLK, a drain coupled to the sources of transistors 902 and 904 and a source coupled to a current source 912.

The output Q is also coupled to the gate of fourth NMOS transistor 914 and the drain of a fifth NMOS transistor 916. Similarly, the output QZ is coupled to the gate of the fifth NMOS transistor 916 and the drain of the fourth NMOS transistor 914. The sources of transistors 914 and 916 are coupled to the drain of a sixth NMOS transistor 918, which transistor has a gate coupled to a clock input CLKZ (the inverse of CLK) and a source coupled to the current source 912.

Figure 10:
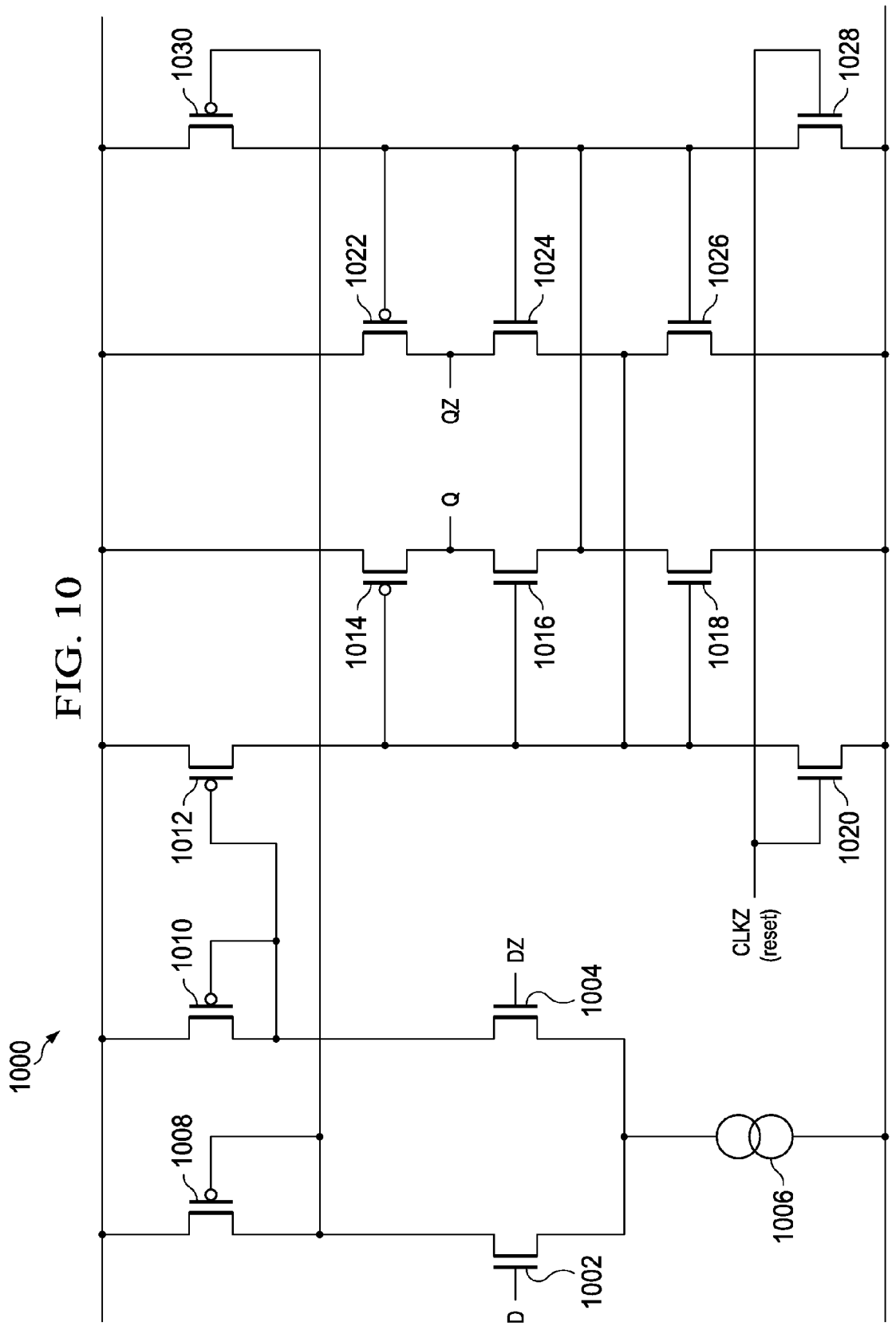
FIG. 10 shows an exemplary circuit diagram of a sense amplifier suitable for use in the circuits of FIG. 6 and FIG. 7.

FIG. 10 shows an exemplary form of the sense amplifier, indicated generally by the reference numeral 1000, used in embodiments of the present invention.

The sense amplifier 1000 has complementary inputs D and DZ and provides complementary outputs Q and QZ. A clock input CLKZ is also provided.

The inputs D and DZ are coupled to the gates of first 1002 and second 1004 NMOS transistors respectively. The sources of those transistors are coupled to current source 1006. The drain of transistor 1002 is coupled to the gate and drain of first PMOS transistor 1008. The drain of transistor 1004 is coupled to the gate and drain of second PMOS transistor 1010 and to the gate of third PMOS transistor 1012. The drain of third PMOS transistor is coupled to the gates of fourth PMOS transistor 1014 third 1016 and fourth 1018 NMOS transistors and to the drain of fifth NMOS transistor 1020. The drains of transistors 1014 and 1016 are coupled to the output Q. The output QZ is coupled to the drains of sixth PMOS transistor 1022 and sixth NMOS transistor 1024. The gates of transistors 1022 and 1024 are coupled together and to the gate of seventh NMOS transistor 1026, the drain of eighth NMOS transistor 1028, the source of NMOS transistor 1016 and the drain of seventh PMOS transistor 1030. The gates of transistors 1020 and 1028 are both coupled to the input CLKZ. The transistors 1018, 1020, 1026 and 1028 have sources coupled to a negative power supply (such as ground). The transistors 1008, 1010, 1012, 1014, 1022 and 1030 have sources coupled to a positive power supply.

Figure 11:
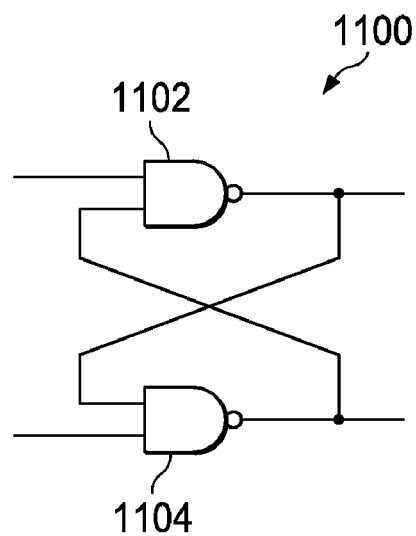
FIG. 11 shows an exemplary circuit diagram of an R-S latch suitable for use in the circuit of FIG. 6 and FIG. 7.#

FIG. 11 shows an exemplary circuit diagram of an R-S latch, indicated generally by the reference numeral 1100, suitable for use in the circuit of FIGS. 6 and 7. The R-S latch comprises first 1102 and second 1104 NAND gates that are cross-coupled to provide a simple latch in a manner well known to those skilled in the art.

The latch 900, sense amplifiers 1000 and R-S latch 1100 described above are examples of circuits that could be used in embodiments of the present invention. The skilled person would, of course, be aware of alternative circuits that could be used.

What is claimed is:

1. A data capture circuit comprising:
a first latch having an input for receiving a data input signal;
a first sense amplifier having an input coupled to an output of the first latch;
a second latch having an input coupled to the output of the first sense amplifier and an output providing a first data output; and
a clock generator comprising:
a third latch having an input for receiving a first clock signal;
a second sense amplifier having an input coupled to an output of said third latch; and
a fourth latch having an input coupled to an output of said second sense amplifier and an output providing a first adjusted clock signal,
wherein said first and third latches are substantially the same, the first and second sense amplifier are substantially the same and the second and fourth latches are substantially the same.

2. A data capture circuit as claimed in claim 1, wherein said first and third latches are CML latches.

3. A data capture circuit as claimed in claim 1, wherein the inputs to said sense amplifiers are differential inputs and the outputs of said sense amplifiers are complementary outputs.

4. A data capture circuit as claimed in claim 1, wherein said second and fourth latches are R-S latches.

5. A data capture circuit as claimed in claim 1, wherein said first latch uses said first clock signal as a clock input.

6. A data capture circuit as claimed in claim 1, comprising a plurality of said first latches arranged in parallel, a plurality of said first sense amplifiers arranged in parallel and a plurality of said second latches arranged in parallel, wherein said plurality of first latches receive a plurality of data inputs and said plurality of third latches provide a first plurality of data outputs.

7. A data capture circuit as claimed in claim 6, wherein each of said plurality of first latches uses said first clock signal as a clock input.

8. A data capture circuit as claimed in claim 7, wherein said plurality of first latches, said plurality of first sense amplifiers and said plurality of second latches form a first analogue-to-digital converter.

9. A data capture circuit as claimed in claim 8, wherein each sense amplifier of said plurality of said first sense amplifier compares data received at its input with a preset level.

10. A data capture circuit as claimed in claim 1, further comprising:
a fifth latch having an input for receiving said data input signal;
a third sense amplifier having an input coupled to an output of the fifth latch;
a sixth latch having an input coupled to an output of the third sense amplifier and an output providing a second data output; and
a second clock generator comprising:
a seventh latch having an input for receiving a second clock signal;
a fourth sense amplifier having an input coupled to an output of said seventh latch; and
an eighth latch having an input coupled to the output of said fourth sense amplifier and an output providing a second adjusted clock signal,
wherein said fifth and seventh latches are substantially the same, the third and fourth sense amplifiers are substantially the same and the sixth and eighth latches are substantially the same.

11. A data capture circuit as claimed in claim 10, wherein said fifth latch uses said second clock signal as a clock input.

12. A data capture circuit as claimed in claim 10, wherein said first and second clock signals are complementary clock signals.

13. A data capture circuit as claimed in claim 10, comprising a plurality of said fifth latches arranged in parallel, a plurality of said third sense amplifiers arranged in parallel and a plurality of said sixth latches arranged in parallel, wherein said plurality of fifth latches receive the plurality of data inputs and said plurality of sixth latches provide a second plurality of data outputs.

14. A data capture circuit as claimed in claim 13, wherein said plurality of fifth latches, said plurality of third sense amplifiers and said plurality of said sixth latches form a second analogue-to-digital converter.

15. An analogue-to-digital converter comprising:
   a plurality of first latches, each having an input for receiving a data input signal;
   a plurality of first sense amplifiers, each having an input coupled to an output of a respective one of the first latches;
   a plurality of second latches, each having an input coupled to the output of a respective one of the first sense amplifiers and an output, the outputs of said plurality of first latches providing a first plurality of data outputs; and
   a clock generator comprising:
      a third latch having an input for receiving a first clock signal;
      a second sense amplifier having an input coupled to the an output of said third latch; and
      a fourth latch having an input coupled to the output of said second sense amplifier and an output providing a first adjusted clock signal,
   wherein said third latch and each of said plurality of first latches are substantially the same, said second sense amplifier and each of said first plurality of sense amplifiers are substantially the same and said fourth latch and each of said plurality of second latches are.

16. An analogue-to-digital converter as claimed in claim 15, wherein each of said plurality of first latches uses said first clock signal as a clock input.

17. An analogue-to-digital converter as claimed in claim 15, further comprising:
   a plurality of fifth latches, each having an input for receiving a or the data input signal;
   a plurality of third sense amplifiers, each having an input coupled to an output of a respective one of said fifth latches;
   a plurality of sixth latches, each having an input coupled to an output of a respective one of the third sense amplifiers and an output providing a second data output; and
   a second clock generator comprising:
      a seventh latch having an input for receiving a second clock signal;
      a fourth sense amplifier having an input coupled to the an output of said seventh latch; and
      an eighth latch having an input coupled to the output of said fourth sense amplifier and an output providing a second adjusted clock signal,
   wherein said seventh latch and each of said plurality of fifth latches are substantially the same, the fourth sense amplifier and each of said plurality of third sense amplifiers are substantially the same and the eighth latch and each of said plurality of seventh latches are substantially the same.

18. An analogue-to-digital converter as claimed in claim 17, wherein said plurality of fifth latches uses said second clock signal as a clock input.

19. An analogue-to-digital converter as claimed in claim 17, wherein said first and second clock signals are complementary clock signals.

20. A method of capturing data, the method comprising the steps of:
   latching an analogue data signal to generate a first latched data signal in response to a first input clock signal;
   passing said first latched data signal through a first sense amplifier; and
   latching the output of said first sense amplifier to generate said first digital data signal,
   the method further comprising the steps of generating a first output clock signal by:
   latching said first input clock signal to generate a first latched clock signal;
   passing said first latched clock signal through a second sense amplifier; and
   latching the output of said sense amplifier to generate said first output clock signal.

21. A method as claimed in claim 20, further comprising the steps of:
   latching said analogue data signal to generate a second latched data signal in response to a second input clock signal;
   passing said second latched data signal through a third sense amplifier; and
   latching the output of said third sense amplifier to generate a second digital data signal,
   the method further comprising the steps of generating a second output clock signal by:
   latching said second clock input signal to generate a second latched clock signal;
   passing said second latched clock signal through a fourth sense amplifier;
   latching the output of said fourth sense amplifier to generate said second output clock signal.

22. A method as claimed in claim 21, wherein said first and second input clock signals are complementary clock signals.

* * * * *